(12) United States Patent
Knapp

(10) Patent No.: US 7,281,082 B1
(45) Date of Patent: Oct. 9, 2007

(54) FLEXIBLE SCHEME FOR CONFIGURING PROGRAMMABLE SEMICONDUCTOR DEVICES USING OR LOADING PROGRAMS FROM SPI-BASED SERIAL FLASH MEMORIES THAT SUPPORT MULTIPLE SPI FLASH VENDORS AND DEVICE FAMILIES

(75) Inventor: Steven K. Knapp, Soquel, CA (US)

(73) Assignee: Xilinx, Inc., San Jose, CA (US)

( * ) Notice: Subject to any disclaimer, the term of this patent is extended or adjusted under 35 U.S.C. 154(b) by 374 days.

(21) Appl. No.: 10/810,032

(22) Filed: Mar. 26, 2004

(51) Int. Cl.
*G06F 12/00* (2006.01)
(52) U.S. Cl. ........................................ 711/103; 326/39
(58) Field of Classification Search ................ 711/103, 711/154; 710/16; 365/185.04, 195, 230.03; 714/28; 326/38
See application file for complete search history.

(56) References Cited

U.S. PATENT DOCUMENTS

| | | | | |
|---|---|---|---|---|
| 5,991,194 A | * | 11/1999 | Jigour et al. | 365/185.04 |
| 6,510,090 B1 | * | 1/2003 | Chida | 365/195 |
| 6,549,482 B2 | * | 4/2003 | Garner | 365/230.03 |
| 6,829,727 B1 | * | 12/2004 | Pawloski | 714/28 |
| 6,867,614 B1 | * | 3/2005 | Le Graverand et al. | 326/38 |
| 7,032,039 B2 | * | 4/2006 | DeCaro | 710/16 |
| 7,051,169 B2 | * | 5/2006 | Ganton | 711/154 |
| 7,095,247 B1 | * | 8/2006 | Tang et al. | 326/38 |
| 2006/0038586 A1 | * | 2/2006 | Xia et al. | 326/39 |

\* cited by examiner

*Primary Examiner*—Brian R. Peugh
(74) *Attorney, Agent, or Firm*—E. Eric Hoffman; Thomas A. Ward; Michael R. Hardaway

(57) ABSTRACT

A method and structure for configuring a programmable logic device (PLD) from a serial peripheral interface (SPI) based serial memory. The type of the SPI memory is initially identified by the PLD. The PLD then selects the appropriate read command in response to the SPI memory type. The PLD then issues the read command to the SPI memory. In response, the SPI memory continuously provides a set of configuration data to the PLD. The PLD is configured in response to the configuration data. The PLD can identify the SPI memory type in response to control signals on pins of the PLD. Alternately, the PLD can identify the SPI memory type by performing a search. The search can include issuing a plurality of known read commands to the SPI memory, and then determining which read command causes the SPI memory to respond.

9 Claims, 3 Drawing Sheets

FLEXIBLE SCHEME FOR CONFIGURING PROGRAMMABLE SEMICONDUCTOR DEVICES USING OR LOADING PROGRAMS FROM SPI-BASED SERIAL FLASH MEMORIES THAT SUPPORT MULTIPLE SPI FLASH VENDORS AND DEVICE FAMILIES

FIELD OF THE INVENTION

The present invention uses the commercially available, low-cost, high density serial flash memories offered by multiple vendors that use the four wire serial peripheral interface (SPI) communication protocol to provide a cost effective configuration storage device for configuring programmable semiconductor devices, or for loading configuration or application programs for stand-alone or embedded processors, digital signal processors, or microcontrollers.

RELATED ART

Programmable logic devices, such as field programmable gate arrays (FPGAs), typically include an array of configuration memory cells that are loaded with configuration data values. These configuration data values control the configuration of the programmable logic device. The configuration data values are initially stored in an external memory device, such as a programmable read only memory (PROM). The configuration data values are transferred from the external memory device to the programmable logic device, often in a serial manner. The programmable logic device includes an interface, which controls the transfer of configuration data values from the external memory device to the programmable logic device.

For example, FPGAs available from Xilinx, Inc. are typically configured from a proprietary serial PROM (hereinafter referred to as a "Xilinx PROM"). The interface of the current Xilinx FPGAs is unidirectional and only connects to Xilinx PROMs. Xilinx PROMs are only sequentially accessed and are not random accessible. Xilinx PROMs are typically written once and read many times. Xilinx PROMs are typically only used for FPGA configuration and are only sold by Xilinx and Atmel.

Serial peripheral interconnect (SPI) based serial flash memories are a relatively recent development. SPI flash memories use an industry-standard, widely supported, four-wire Serial Peripheral Interconnect (SPI) interface versus the proprietary Xilinx serial interface. SPI is a moderate to high-bandwidth, multi-purpose, full-duplex, synchronous communications interface supported by a variety of peripheral components such as memories, sensors, A/D converters, and D/A converters. Many modern embedded processors include an SPI interface.

The four signals of the serial peripheral interface are SS# (an active-Low slave select signal), SCK (a serial clock signal), SI (a slave serial data input), and SO (a slave serial data output). Additional details on SPI can be found in "Introduction to Serial Peripheral Interface" By David Kalinsky and Roee Kalinsky, Embedded Systems Programming, Feb. 1, 2002.

At least five vendors presently supply SPI-based flash memories, including Atmel, STMicroelectronics, Silicon Storage Technologies (SST), NexFlash (formerly ISSI), and Programmable Microelectronics Corporation (PMC). Because these devices are used in high-volume applications like cellular phone and engine controllers, SPI-based serial flash will eventually cost 5% less than commodity byte-wide flash memories, according to SPI flash memory vendors.

SPI flash memories have densities ranging from 512 Kbits to 64 Mbits available today and up to 256 Mbits in development. Similarly, commodity MultiMediaCards (MMCs) used in digital cameras have an optional SPI interface, potentially offering densities up to 1 Gigabit.

SPI flash memories are in-system re-programmable via the same native interface used for FPGA configuration. This allows most SPI flash devices to fit in space-saving 8-pin packages. In contrast, Xilinx PROMs require a separate JTAG interface, requiring additional pins and consequently, larger packages.

SPI flash memories are random-access, byte-addressable and writeable using the native SPI interface, making them useful for storing other non-volatile data beyond just configuration data. In contrast, Xilinx serial PROMs are only sequentially accessed and are not random accessible.

SPI flash memories are becoming a popular method for configuring options or storing application code for ASIC devices. However, although SPI-based serial flash devices share the same four-wire interface, each vendor and each vendor device family uses a slightly different command protocol that prevents users from easily using multiple vendors.

Currently, there are two competing non-volatile serial configuration technologies as listed below.

The first non-volatile serial configuration technology includes serial-sequential access serial (SSA) PROMs, like those used by Xilinx, Altera, Atmel, and Triscend. These devices present a serial data bit on every clock edge. In the case of Xilinx XC17xx, Xilinx XC18xx, and Atmel AT17xx, these devices present serial data when an external clock provides a rising clock edge. In the case of Altera "Configurators", the serial PROM presents the both the clock signal and serial data to the associated FPGA device.

The primary advantage of these SSA PROMs is that they have a simple two-wire communications interface that requires little communications overhead within the associated FPGA. Modern versions of these SSA PROMs also have relatively high bandwidth interfaces to the FPGA, operating up to 66 MHz. Furthermore, these devices operate with the majority of existing FPGA devices, which already contain an interface to support the SSA PROM architecture.

The primary disadvantage of SSA PROM devices, when compared to SPI flash memories, is that they are generally more expensive for comparable densities. SSA PROMs are specialty PROMs designed specifically to configure FPGAs. SPI flash memories are used in a wider variety of high-volume applications. Consequently, they are manufactured in higher production volumes by multiple vendors, resulting in a price-competitive market environment. The SSA PROM interface is for the sole purpose of configuring the FPGA. Because of its serial sequential nature, the interface does not easily support random access into to the memory array. By contrast, SPI is a widely-supported, popular protocol used by a variety of peripheral components such as memories, sensors, analog-to-digital and digital-to-analog converters, etc. Similarly, many embedded processors include an SPI interface as a standard peripheral. Writeable SSA PROMs require a separate programming/write interface. The second interface provides the random-access capability required for programming. Xilinx 18xx SSA Flash PROMs use the four-wire JTAG serial protocol popular in manufacturing and test environments. The Atmel AT17xx SSA flash PROMs use the two-wire I2C protocol for programming. Both the JTAG and I2C interfaces have a lower bandwidth than the SPI interface. The JTAG interface on Xilinx PROMs requires four additional dedicated I/O pins, which requires that these devices have larger pin-count packages. The Atmel I2C interface shares some pins with the SSA interface. In contrast, SPI flash memories are programmed/written and read via the same four-wire interface allowing these devices to be packaged in space-efficient, low-cost packages.

The second non-volatile serial configuration technology includes I2C-based PROMs. The advantage of I2C-based PROMs is that they have a simple two-wire read/write interface. Like SPI, I2C is a common interface supported by a wide variety of peripheral components.

The primary disadvantages of I2C-based PROMs are that they typically have lower densities and significantly lower communications bandwidth (400 kHz vs. 25 MHz+ on SPI.). Also, pull-up resistors are required on both I2C serial lines. Furthermore, it may be necessary to obtain a license from Philips Semiconductor to use the I2C protocol.

It would therefore be desirable to have a programmable logic device that can be configured from any one of a plurality of SPI flash memory devices. That is, it would be desirable to have a programmable logic device having an interface that provides a flexible interface to multiple vendors and SPI device families.

SUMMARY

Accordingly, the present invention provides a programmable logic device (PLD) having SPI-based configuration logic. The SPI-based configuration logic performs the following steps when connected to an SPI-based flash device.

First, the SPI-based configuration logic identifies the vendor and device family of the attached SPI-based serial flash or similar device. Depending on how this function is implemented, the user may be required to indicate the device family via some electrical specification means such as tying pins to a logic high or low state, or by setting internal non-volatile configuration bits. In alternate implementations, at power-up or after reset, the PLD's configuration mode select pins are set appropriately, such that the PLD becomes an SPI bus master. Via the SPI protocol, the PLD identifies the attached SPI flash device and vendor. While every SPI-based serial PROM uses the same physical protocol, each vendor supports a slightly different command structure. The PLD discovers the identity of the SPI flash device by issuing multiple Read Status commands until the attached SPI flash device responds with an identifiable response.

After the PLD identifies the vendor and device type, the PLD issues the correct commands to read the configuration data from the SPI flash device. For example, the PLD may issue a "Read-Continuous" command. As part of the command, the PLD specifies the start address for the read operation. The start address is defined in a register within the PLD. At power-on, the register is cleared to a "0" value. After power-on, the register can be loaded with another value by the user's application, thereby allowing a single SPI flash to store multiple configurations. After specifying the start address, the PLD then continuously reads the SPI flash until the PLD is configured or until the read command reaches the end of the SPI flash.

If the read operation reaches the end of the SPI flash memory before configuration is complete, the PLD de-asserts a first serial flash select line coupled to the SPI flash memory, and asserts a second flash select line coupled to a second SPI flash memory, thereby enabling a second SPI flash memory. Note that additional SPI peripherals can easily connect to the PLD and share the SPI data and clock pins. One additional PLD pin per device would be required (e.g. an enable pin).

After configuring the PLD, the serial flash interface is available to the application logic implemented in the PLD as a non-volatile storage device.

The SPI-based configuration logic of the present invention is similar to that which exists for Xilinx serial PROMs. This SPI-based configuration logic can therefore readily co-exist with the present Xilinx serial configuration scheme. The high-density SPI flash devices can potentially reduce FPGA configuration costs by up to 80%.

The additional density provided by an SPI flash device is important because a single SPI flash device may potentially contain FPGA configuration data, application data, and application code for hard or soft processors embedded within the FPGA. Application code would typically be copied to a secondary memory such as internal block RAM or external DRAM before the processor executes the code.

In accordance with another embodiment, an interface between a JTAG unit on the PLD can be configured to allow the SPI flash to be programmed and verified through the PLD's JTAG pins, thereby simplifying board testing and manufacturing. Even without a special interface between the JTAG and SPI interfaces, it is possible to toggle the SPI pins via the JTAG interface, albeit slowly. The purpose of any special interface logic would be to improve data transfer performance.

Note that connections from within the PLD advantageously allow the SPI interface to be re-used to connect to the wide variety of SPI-based peripheral components.

The present invention will be more fully understood in view of the following description and drawings.

DETAILED DESCRIPTION

Figure 1:
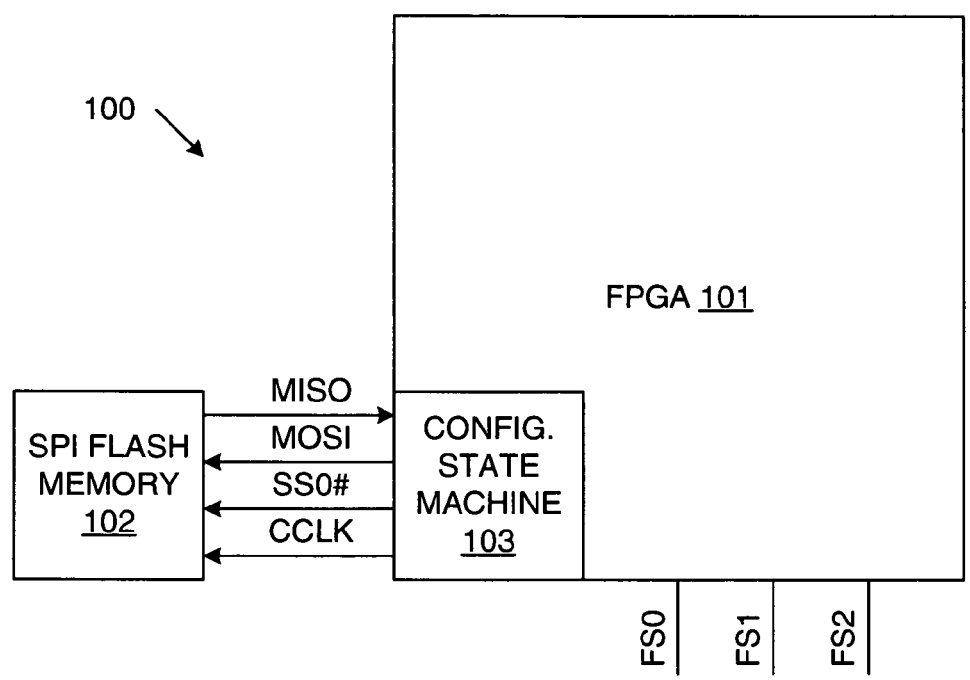
FIG. 1 is a block diagram of a system that includes a programmable logic device and an associated SPI-based flash memory device.

FIG. 1 is a block diagram of a system 100 that includes programmable logic device (PLD) 101 and an associated SPI-based flash memory device 102. In the described embodiments, PLD 101 is an SRAM-based field programmable gate array (FPGA). However, the present invention is applicable to other types of programmable devices, including but not limited to microcontrollers or embedded processors. FPGA 101 includes a configuration state machine 103 and input/output pins FS0, FS1 and FS2.

In general, system 100 operates as follows.

First, FPGA 101 identifies the vendor and device family of the attached SPI-based memory device 102.

Second, FPGA 101 issues the correct read command, typically unique for the identified SPI-based memory device 102, including the starting address, and any dummy bytes, if required by the SPI flash device used in the application.

Third, FPGA 101 continuously reads the configuration data from the SPI memory device 102, either until the FPGA 101 finishes configuration, or until the entirety of the SPI memory device 102 is read.

Fourth, FPGA 101 makes the SPI memory interface (e.g., configuration state machine 103) available to the application logic implemented in the configured FPGA 101.

Fifth, FPGA 101 provides a means for programming the SPI memory interface in the system 100.

These five steps are described in more detail below.

Identify the Attached SPI-Based Memory

For the specific application of configuring an FPGA, there are multiple vendors that build SPI-based, dense, non-volatile memory devices or modules, as listed in Table 1. There is a memory card standard called MultiMediaCard (MMC). By strapping one of the MMC interface pins to a specified logic level, the interface either operates according the MMC standard or as an SPI device.

TABLE 1

SPI-Based, Dense, Non-Volatile Memories.

| Vendor | Device Family |
|---|---|
| STMicroelectronics (ST) | M25Pxx |
| STMicroelectronics (ST) | M45PE |
| Silicon Storage Technology, Inc. (SST) | SST25VF |
| Silicon Storage Technology, Inc. (SST) | SST45LF |
| Atmel | AT45xx DataFlash |
| NexFlash | NX25P |
| Programmable Microelectronics Corporation (PMC) | Pm25LV |
| Various | MultiMediaCard (MMC) |

There are at least three known methods to identify the attached SPI-based memory devices, as listed below. First, FPGA 101 can identify SPI flash memory 102 in response to electrical values applied or implied on the FFGA device pins (FS0-FS2). Second, FPGA 101 can identify SPI flash memory 102 in response to non-volatile configuration bits stored within FPGA 101. Third, FPGA 101 can identify SPI flash memory 102 using a search scheme. These three methods are described in more detail below.

Identifying SPI Flash Vendor/Family Using Device Pins

Using device pins to select the SPI flash algorithms is probably the simplest implementation. In this embodiment, the configuration mode settings of FPGA 101 are selected such that configuration state machine 103 operates as an SPI Master. Applying the predetermined binary value of logic high and low states on the FPGA Configuration Mode Select pins (identified as M2, M1, and M0 in the current Xilinx product families) selects the SPI flash configuration mode from the various configuration options.

In this mode, FPGA 101 samples the electrical level on three flash select pins (FS0 through FS2), which are temporarily borrowed during the configuration process, as shown in FIG. 1. The resulting binary value on these pins defines the behavior of a state machine within the FPGA that connects to and controls the SPI flash interface. These flash select pins are made available to the application after configuration.

The three flash select pins FS0-FS2 are coupled to weak pull-up resistors within FPGA 101 during configuration. A specific SPI-based flash memory device is selected by connecting one or more external pull-down resistors to flash select pins FS0-FS2, or by allowing all three pins to float high.

TABLE 2

Possible Vendor Encoding for Identifying SPI PROMs

| Vendor | Device Family | FS0 | FS1 | FS2 |
|---|---|---|---|---|
| STMicroelectronics (ST), NexFlash, and Programmable Microelectronics Corporation (PMC) | M25Fxx NX25P Pm25LV | 1* | 1* | 1* |
| Silicon Storage Technology, Inc. (SST) | SST25VF | 1* | PD | PD |
| Silicon Storage Technology, Inc. (SST) | SST45LF | 1* | 1* | PD |
| Atmel | AT45xx DataFlash | 1* | PD | 1* |
| Various | MultiMediaCard (MMC) | PD | 1* | PD |

In Table 2, the symbol "1*" indicates that the associated flash select pin is pulled high via the internal weak pull up. The designer should only use a flash select pin designated by the symbol "1*" as an output pin after configuration (or guarantee that any input pin drives this pin high during configuration). The symbol "PD" indicates that the associated flash select pin is pulled low using an external pull-down resistor, or is driven low via an external signal. The advantage of this approach is that it greatly reduces the complexity of the control logic and minimizes the number of I/O pins borrowed during configuration.

Identifying SPI Flash Vendor/Family Using Non-Volatile Configuration Bits of FPGA 101

SPI flash memory 102 can also be identified by a set of three or more non-volatile configuration bits stored by FPGA 101. These non-volatile configuration bits can be encoded in the manner set forth above in Table 2.

Identifying SPI Flash Via Search

Another method for identifying the attached SPI flash memory 102 is for FPGA 101 to issue various commands to SPI flash memory 102 and examine the response. The commands may read the manufacturer's ID value or device ID value, read the device status, or us a combination of commands. Every vendor/device-family combination potentially has a different Read Status command, as listed in Table 3. However, the STMicro M25Pxx, the NexFlash NX25P, and the PMC Pm25LV families have some command commonalties. Likewise, most vendors have different Read ID commands.

TABLE 3

Read Status Commands for Various Vendor/Device-Family Combinations.

| Device Family | Read Status Command | Read Manufacture/Device ID Command |
|---|---|---|
| Atmel AT45xxData Flash | 0x57 | N/A |
| STMicro M25Pxx | 0x05 | 0xAB |
| STMicro M45PExx | 0x05 | 0xAB |
| SSTI SST25VF | 0x05 | 0xAB |
| SSTI SST45LF | 0x9F | 0x90 |
| NexFlash NX25P | 0x05 | 0xAB |

TABLE 3-continued

Read Status Commands for Various Vendor/Device-
Family Combinations.

| Device Family | Read Status Command | Read Manufacture/Device ID Command |
|---|---|---|
| PMC Pm25LV | 0x05 | 0xAB |
| MultiMediaCard (MMC) | Unknown | Unknown |

Figure 2:
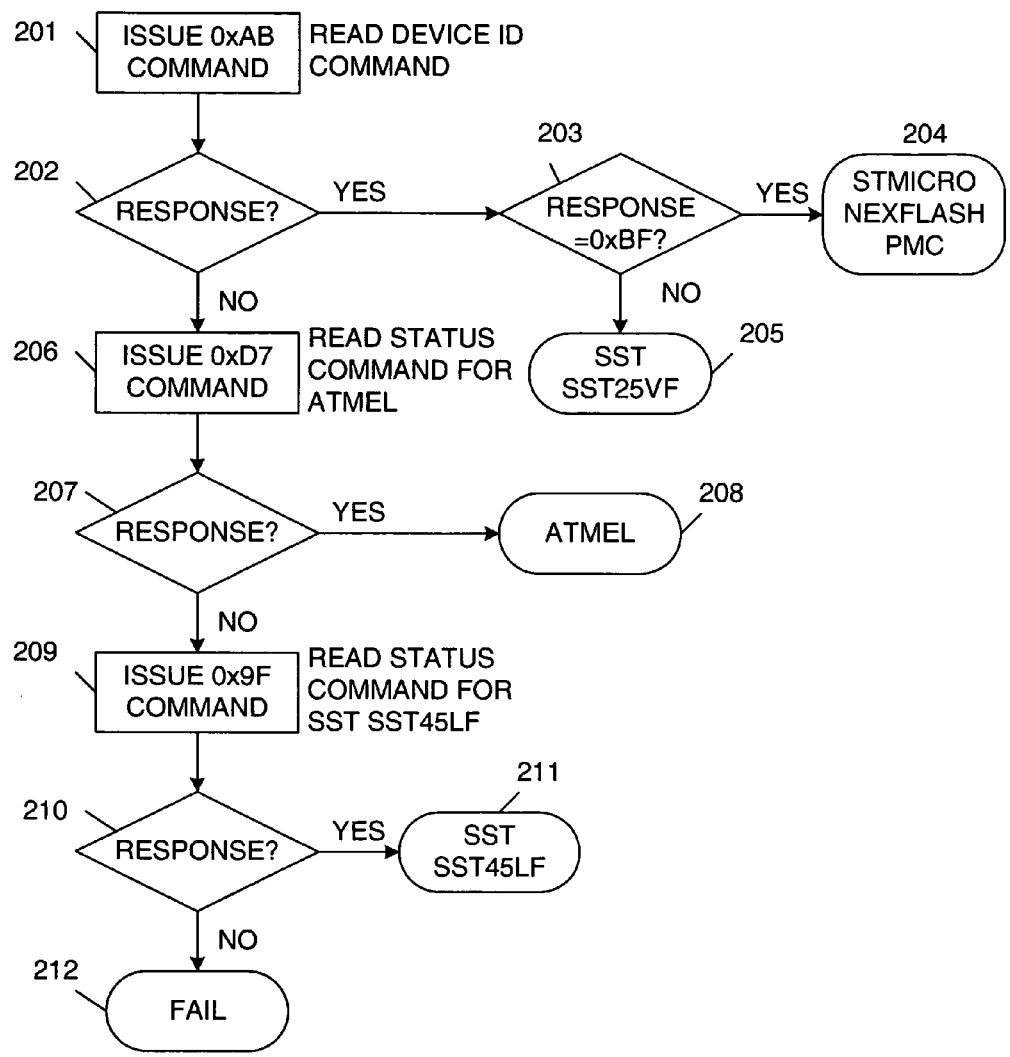
FIG. 2 is a flow diagram illustrating Read Status commands issued by the programmable logic device of FIG. 1 in accordance with one embodiment of the present invention.

The SPI flash devices appear to be designed so that they do not respond to an unrecognized command. Via an internal processor, sequencer, or state machine, FPGA 101 issues various Read Status or Read Manufacture/Device ID commands until SPI flash memory 102 responds. FIG. 2 is a flow diagram illustrating the commands issued by FPGA 101 in accordance with one embodiment of the present invention. Thus, as illustrated in FIG. 2, FPGA 101 first issues a "0xAB" command to SPI flash memory 102 (Step 201), which is a Read Device ID command for some of the SPI flash memories listed in Table 3. If SPI flash memory 102 provides a response (Step 202, Yes branch), then FPGA 101 must further delineate whether the SPI flash memory 102 is an STMicroelectronics-compatible device (STMicroelectronics, NexFlash, or PMC) or a Silicon Storage Technology SSTISST25VF device because all these devices use 0xAB for the Read Device ID command). Consequently, if SPI flash memory 102 responds, then FPGA 101 must further examine the response from the Read ID command to uniquely identify the vendor/device combination (Steps 203-205). For example, if the response from the Read Device ID command is 0xBF, then the attached SPI Flash is an SSTISST25VF memory.

If SPI flash memory 102 does not respond to the 0xAB command (Step 202, No branch), then FPGA 101 issues a "0xD7" Read Status command (Step 206), which is associated with the Atmel devices. If there is a response (Step 207, Yes branch), then FPGA 101 identifies SPI flash memory 102 as an Atmel device. If there is no response (Step 207, No branch), then FPGA 101 issues a "0x9F" Read Status command (Step 209), which is associated with the Silicon Storage Technology SST45LF devices. If there is a response (Step 210, Yes branch), then FPGA 101 identifies SPI flash memory 102 as a Silicon Storage Technology SST45LF device (Step 211). If there is no response (Step 210, No branch), then the FPGA configuration process fails (Step 212), and FPGA 101 asserts its INIT_B pin to indicate that the FPGA configuration process failed. Although the above method does not describe how to identify a MultiMediaCard, similar techniques would apply. However, MMCs have a more complex software interface.

Issue the Read Command Associated with the Identified SPI Flash Memory

After correctly identifying the attached SPI flash memory 102, FPGA 101 must then issue the correct Read command for the specific vendor/device combination. Some SPI Flash vendors have multiple read commands. FPGA 101 selects a Read command that automatically increments the read address during a continuous read operation. Essentially, FPGA 101 specifies an initial start address and continuously reads SPI flash memory 102 until FPGA 101 is configured or until the SPI flash memory 102 is expended.

The SPI flash Read command consists of the following: (1) a byte-wide Read Command; (2) a Start Address, either 24 bits or 32 bits wide; and (3) In some cases, Dummy bytes that allow the SPI flash to read the array and present data on the output pins.

Table 4 shows the applicable command code and command format for the various SPI flash devices. After issuing the proper Read command, FPGA 101 continues to provide the CCLK signal to SPI flash memory 102, and receives the serial data provided by SPI flash memory 102 on the MISO pin.

TABLE 4

Various SPI-Based Memories and Read Commands and Command Formats.

| Family | Command | Command Code | Command Format |
|---|---|---|---|
| Atmel At45xx | Continuous Array Read | 0x68 or 0xE8 | 24-bit address; 32 don't care bits |
| STMicro M25Fxx or M45PExx | Fast Read Command | 0x0B | 24-bit address dummy byte |
| SSTI SST25LF | Read Command | 0x03 | 24-bit address |
| SSTI SST45LF | Read Command | 0xFF | 24-bit address; two dummy bytes |
| NexFlash NX25P | Fast Read Data | 0x0B | 24-bit address; dummy byte |
| PMC Pm25LV | Fast Read | 0x0B | 24-bit address; dummy byte |
| MultiMediaCard (MMC) | Unknown | Unknown | Unknown |

Figure 3:
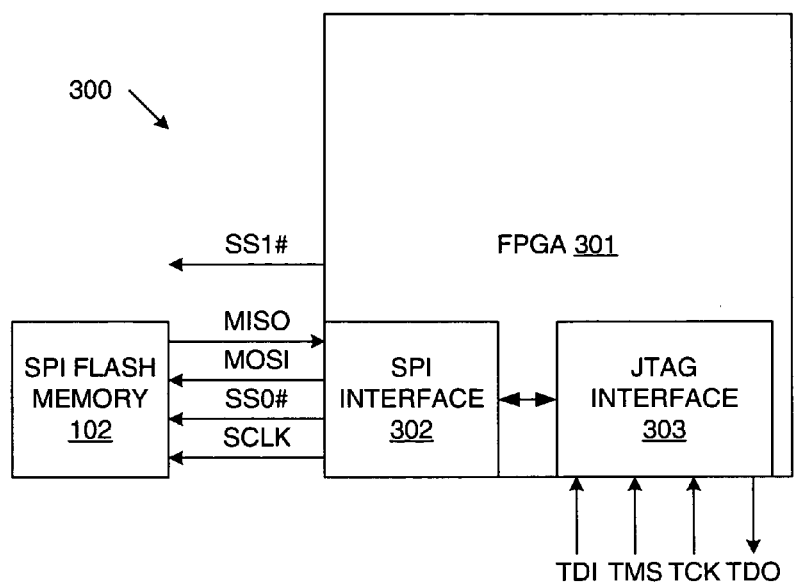
FIG. 3 is a block diagram of a system that includes an SPI memory and a programmable logic device having a full-featured SPI flash interface, in accordance with another embodiment of the present invention.

FIG. 3 is a block diagram of a system 300 that includes SPI flash memory 102 and FPGA 301, which has a full-featured SPI flash interface, including Internal SPI Interface 302, JTAG interface 303, and flash expansion line SS1#. System 300 operates as follows in accordance with one embodiment of the present invention.

Start Address

Figure 4:
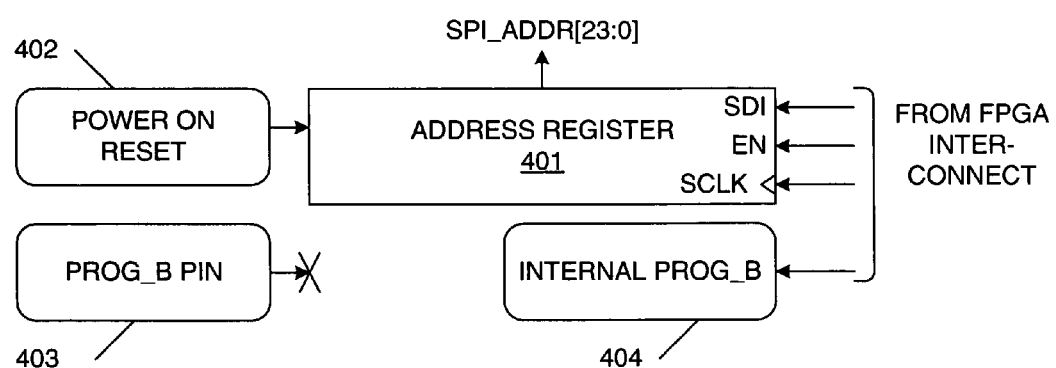
FIG. 4 is a block diagram of a 24-bit address register, which is present in the SPI interface of the system of FIG. 3 in accordance with the described embodiment.

FIG. 4 is a block diagram of a 24-bit address register 401, which is present in SPI interface 302 in accordance with the described embodiment. Only 24 address bits are required by SPI flash devices available today. However, the size of this register could be extended to address larger future SPI flash memories.

At power-up, the contents of address register 401 (i.e., SPI_ADDR[23:0]) are reset to "0" by the power-on-reset (POR) circuit 402. Consequently, FPGA 301 always loads its initial configuration data from address "zero" of SPI flash memory 102. After FPGA 301 completes configuration, the FPGA application can then optionally write a new address into the address register, most significant byte first. The interface to address register 401 is bit serial with a serial data input (SDI), a serial clock input (SCLK), and an EN input (EN) that selects address register 401. Again, this interface looks very much like an SPI interface. A different SPI flash address could then be easily and efficiently stored in two SRL16 primitives. The SRL16 primitive is a 16-bit serial-in/serial-out shift register unique to some Xilinx and Lattice Semiconductor FPGA families. In accordance with one embodiment, the function of the external PROG_B programming pin 403 is also provided within FPGA 301 and there is an internal means 404 for FFGA 301 to assert the PROG_B signal, as shown in FIG. 4. This internal PROG_B signal is an asynchronous input with a minimum pulse-width requirement. When the internal PROG_B signal is activated, FPGA 301 is reprogrammed (e.g., from configuration data stored in SPI memory 102). The purpose for the internal PROG_B control is so that the FPGA can define a different start address in the SPI flash and load a new configuration image. To avoid accidental reprogramming, this signal can be a "protected" input where the application must write a fixed pattern, for example 0xA5 serially, to cause FPGA 301 to re-program via internal logic.

With the internal PROG_B signal, the behavior of the PROG_B pin 403 is modified so that this pin 403 can actively drive a low output signal to reprogram a multi-FFGA design. PROG_B pin 403 only actively drives a low output signal if triggered by the internal PROG_B signal.

Address register 401 is only reset by POR circuit 402, and is not affected by signals on PROG_B pin 403, or the internal PROG_B signal. The application of FPGA 301 can reset address register 401 to zero by some means.

One application for the described system is a multi-configuration design, wherein FPGA 301 itself may decide to load a different FPGA configuration, which is stored in SPI flash memory 102. In one example, the initial configuration contains a design that allows FPGA 301 to determine the board slot into which the FPGA has been inserted. FPGA 301 then loads another SPI flash address (identifying a second set of configuration data associated with the determined slot) into address register 401, assert the internal PROG_B signal, and then load the second set of configuration data specified by the SPI flash address from SPI flash memory 102.

The ability to specify another address within SPI flash memory 102 also allows FPGA 301 to perform live updates, wherein FPGA 301 receives a new configuration image from an external source and writes the new image to SPI flash memory 102 (and has a default configuration as well).

Perform a Continuous Read Operation Until the End of the Configuration Operation After issuing the correct Read command, the Start address, and applicable Dummy bytes, FFGA 301 continues providing the SCLK to SPI flash memory 102 and receiving data from SPI flash memory 102 on the DIN/D0 pin. Initially, FPGA 301 provides the SCLK signal at the minimum frequency supported by the slowest SPI flash memory device. A bit or set of bits early in the configuration program received from SPI flash memory 102 indicates the maximum clock frequency supported by SPI flash memory 102. Upon receiving this maximum clock frequency, FPGA 301 can increase the frequency of the SCLK signal to this maximum clock frequency, thereby decreasing the overall configuration time.

FPGA 301 continues reading configuration data from SPI flash memory 102 until the configuration operation is complete. SPI flash interface 302 can be used to program a stand-alone FPGA or a daisy-chain with additional FPGAs in a Serial Slave mode. In SPI mode, FPGA 301 passes data to the DOUT pin (not shown), just like it does in its other configuration modes.

In accordance with one variation of the present invention, SPI interface 302 is configured to assert more than one SPI slave select signal. For example, assume that a daisy-chained FPGA structure requires 11 Mbits of configuration data values. If SPI interface 302 is configured to support expansion, then the application could retrieve configuration data from an 8 Mbit serial Flash and a 4 Mbit serial Flash. Initially, SPI interface 302 activates the SS0# slave select signal, which is coupled to the 8 Mbit SPI flash memory. As a result, SPI interface 302 enables 8 Mbit of configuration data to be retrieved from the 8 Mbit SPI flash memory. When the 8 Mbit flash memory is exhausted, then SPI interface 302 automatically activates an SS1# slave select signal, which is coupled to the 4 Mbit SPI flash memory. As a result, SPI interface 302 enables the remaining 3 Mbits of the 11 Mbit configuration data to be retrieved from the 4 Mbit SPI flash memory.

The SPI Interface is Made Available after Configuration for Use by the FPGA Application SPI interface 302 is available to the FPGA application after configuration has been completed. Thus, SPI interface 302 is re-usable and can connect to additional SPI flash memories [or peripherals] (not shown). The FPGA application needs to be able to read and write to random locations within the SPI flash memories. FPGA 301 is able to control the SCLK signal, the MOSI signal, and the MISO signal directly. Additional slave select signals (e.g., SS1#, SS2#) are asserted via user I/O pins of FPGA 301.

Table 5 summarizes the connections between and the directionality of pins of FPGA 301 and the SPI flash devices during the FPGA configuration process. The MOSI and MISO connections become bi-directional after configuration.

TABLE 5

Configuration Connections If FPGA Has Re-usable SPI Interface After Configuration.

| SPI Flash Connection | FPGA Configuration Connection | FPGA Direction |
| --- | --- | --- |
| MOSI (Master Output/Slave Input) | DIN/D0 | Output |
| MISO (Master Input/Slave Output) | DIN/D0 | Input |
| SS# | DONE or another dedicated pin | Output |
| SCLK | CCLK | Output |

However, if there is no plan to make SPI interface 302 re-usable after FPGA configuration, then one configuration pin can be saved on FPGA 301. SPI flash memories either read data or write data, but not both simultaneously. Consequently, the MOSI and MISO pins of SPI flash memory 102 can be connected together and to the DIN/DO pin of FPGA 301, which must operate as a bi-directional I/O. Table 6 provides additional details.

TABLE 6

Configuration Connections If FPGA Does Not Have SPI Interface After Configuration.

| SPI Flash Connection | FPGA Configuration Connection | FPGA Direction |
| --- | --- | --- |
| MOSI (Master Output/Slave Input) | DIN/D0 | Bi-directional |
| MISO (Master Input/Slave Output) | DIN/D0 | Bi-directional |
| SS# | DONE or another dedicated pin | Output |
| SCLK | CCLK | Output |

In both cases, the configured FPGA 301 needs the ability to drive each of these pins, including the CCLK pin. In conventional FPGAs, the CCLK pin is three-stated (with an optional pull-up) after configuration is complete.

Programming the SPI Flash Memory in the System

Most commercially available SPI flash devices are packaged in extremely small 8-pin SOIC packages. They are designed to be programmed via the native SPI interface. However, many FPGA customers use JTAG as their programming means.

Programming Via Dedicated JTAG Connection

Potentially the most useful method of programming SPI flash memory 102 is via a JTAG-to-SPI interface 303 in the FPGA. A separate scan chain and new instructions to support SPI flash programming are added to the FPGA JTAG circuitry. The dedicated logic provides so-called "private" JTAG instructions to maximize data bandwidth and reduce the protocol overhead of standard JTAG instructions. Software within FPGA 301 downloads the SPI start address and data via JTAG interface 303. FPGA 301 converts the JTAG commands to SPI flash programming commands. An example interface is shown in FIG. 3.

Another approach is to use the existing JTAG boundary-scan chain and individually toggle the SPI interface pins on the FPGA. This technique is lowest cost but is significantly slower than providing dedicated logic between the JTAG and SPI flash interfaces.

These techniques allow the SPI flash interface to be programmed regardless of whether the FPGA is configured or not.

Programming Via Soft JTAG Interface

An alternate approach to JTAG programming only applies if the FPGA is configured. In one embodiment, FPGA 301 includes a Xilinx IP module that can be configured to implement a JTAG UART. This Xilinx IP module is described in more detail in OPB JTAG UART (http://www.xilinx.com/xlnx/xebiz/designResources/ip product details.jsp?key=OPB JTAG UART). SPI flash memory 102 can be programmed via this JTAG UART and some additional CLB logic, but only after the FPGA is configured. This post-configuration FPGA logic is also to maximize data bandwidth of the existing JTAG interface, similar to the dedicated JTAG-to-SPI interface described earlier.

Programming Via SPI

Another potential means to program SPI flash memory 102 is to use the SPI interface inherent in the SPI flash memory. The interface becomes a bit more complex because the pins of FPGA 301 that connect to SPI flash memory 102 must be three-stated during the programming process.

There are two possible solutions to three-state the pins of SPI interface 302, depending on whether FPGA 301 is configured or not.

If FPGA 301 is not configured, then holding the PROG_B pin low automatically three-states the pins connected to SPI flash memory 102. An intelligent host or microcontroller (not shown) then programs SPI flash memory 102 via a separate interface. After programming is complete, the intelligent host three-states the pins of SPI interface 302. FPGA 301 then holds the PROG_B high, thereby causing FPGA 301 to automatically start the SPI configuration process. Assuming the mode pins are set correctly, FPGA 301 loads the configuration data stored in SPI flash memory 102.

If FPGA 301 is configured, then the FPGA can be used to program SPI flash memory 102. For example, after configuration, FPGA 301 may contain a UART and a small embedded controller. A new SPI flash configuration can be downloaded from an external source via the UART. FPGA 301 then uses the data received via UART and programs the new program into SPI flash memory 102. FPGA logic, usually a small embedded controller, manages the SPI flash programming process.

After configuration, the SPI flash memory 102 serves a multitude of purposes, some of which are listed below.

SPI flash memory 102 can store application programs for one or more processors embedded within FPGA 301. Logic within FPGA 301 copies the processor's application program to some form of faster, wider memory, such as internal block RAM, or external RAM such as SRAM, DRAM, SDRAM, or DDR RAM.

SPI flash memory 102 can also provide writeable, random-access, non-volatile storage for storing parameters, setup information, ID codes, serial numbers, IP or Ethernet addresses, or filter co-efficients.

Although the invention has been described in connection with several embodiments, it is understood that this invention is not limited to the embodiments disclosed, but is capable of various modifications, which would be apparent to one of ordinary skill in the art. For example, other techniques can be used to identify the SPI flash vendor and device beyond those described. Moreover, although the invention has been described with reference to SPI flash memory, the general techniques could apply to other forms of serial memory that have a command-based interface, such as I2C, MicroWire, 1-Wire, and others. Moreover, the present invention is applicable to other fields. In general, any device required to load configuration or program data at power-up could potentially leverage this technique. This would include processors, microcontrollers, ASSPs, some ASIC and gate arrays, digital signal processors, etc. Thus, the present invention is only limited by the following claims.

I claim:

1. A method of configuring a programmable logic device from a serial memory, the method comprising:
   identifying a type of the serial memory with the programmable logic device by applying control signals via one or more pins of the programmable logic device and identifying the type of the serial memory in response to the control signals;
   selecting a read command in response to the type of the serial memory;
   issuing the read command from the programmable logic device to the serial memory;
   retrieving configuration data from the serial memory in response to the read command; and
   configuring the programmable logic device in response to the retrieved configuration data.

2. The method of claim 1, wherein the step of identifying the type of the serial memory comprises:
   issuing a first read command from the programmable logic device to the serial memory;
   determining that the serial memory is non-responsive to the first read command;
   issuing a second read command, which is different than the first read command, from the programmable logic device to the serial memory;
   determining that the serial memory is responsive to the second read command; and
   identifying the type of the serial memory by the responsiveness of the serial memory to the second read command.

3. The method of claim 1, wherein the step of issuing the read command from the programmable logic device to the serial memory comprises:

transmitting a read command from the programmable logic device to the serial memory; and transmitting a start address from the programmable logic device to the serial memory.

4. The method of claim 3, wherein the step of issuing the read command from the programmable logic device to the serial memory further comprises transmitting one or more dummy bytes from the programmable logic device to the serial memory.

5. The method of claim 3, further comprising initializing the start address in the programmable logic device when the programmable logic device is powered on.

6. The method of claim 5, further comprising modifying the start address in the programmable logic device to a second start address after the programmable logic device is configured.

7. The method of claim 6, further comprising:

issuing a second read command from the programmable logic device to the serial memory, wherein the second read command includes the second start address;

retrieving a second set of configuration data from the serial memory in response to the second read command, starting at the second start address; and reconfiguring the programmable logic device in response to the second set of configuration data.

8. The method of claim 1, wherein the step of retrieving the configuration data from the serial memory is performed as a continuous read operation.

9. The method of claim 1, wherein the serial memory is a standard peripheral interface (SPI) flash memory.

\* \* \* \* \*